US012289858B2

United States Patent
Chen et al.

(10) Patent No.: US 12,289,858 B2
(45) Date of Patent: Apr. 29, 2025

(54) CONTROLLED AIRFLOW DESIGN FOR INDOOR CABINET

(71) Applicant: Quanta Computer Inc., Taoyuan (TW)

(72) Inventors: Yi-Chieh Chen, Taoyuan (TW);
Yueh-Chang Wu, Taoyuan (TW);
Te-Chuan Wang, Taoyuan (TW);
Tzu-Hsuan Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 241 days.

(21) Appl. No.: 18/165,849

(22) Filed: Feb. 7, 2023

(65) Prior Publication Data
US 2024/0268059 A1 Aug. 8, 2024

(51) Int. Cl.
*H05K 7/20* (2006.01)

(52) U.S. Cl.
CPC ..... *H05K 7/20145* (2013.01); *H05K 7/20209* (2013.01)

(58) Field of Classification Search
CPC ........... H05K 7/20736; H05K 7/20209; H05K 7/20745; H05K 7/20572; H05K 7/207; H05K 7/20754; H05K 7/20145; H05K 7/20181; H05K 7/20781; H05K 7/20; H05K 7/20609; H05K 7/20727; H05K 7/2079;
(Continued)

(56) References Cited

U.S. PATENT DOCUMENTS 5,544,012 A * 8/1996 Koike ................ H05K 7/20572
165/122
6,104,003 A * 8/2000 Jones ..................... H05K 7/207
219/400
(Continued)

FOREIGN PATENT DOCUMENTS

CN 107072119 A 8/2017
CN 111629552 A 9/2020
(Continued)

OTHER PUBLICATIONS

Koike, Cooling Structure of Computer, Apr. 19, 2002, JP2002118387 (Year: 2002).*
(Continued)

*Primary Examiner* — Michael A Matey
(74) *Attorney, Agent, or Firm* — NIXON PEABODY LLP

(57) ABSTRACT

An example compute cabinet assembly includes an equipment room configured to implement electrical components therein, an air inlet channel coupled to a first side of the equipment room, and a cabinet fan module coupled to a second side of the equipment room opposite the first side. A first air outlet channel is coupled to the cabinet fan module and extends along a third side of the equipment room towards a first outlet of the first air outlet channel. Moreover, electric fans are positioned in the cabinet fan module, the electric fans being configured to create an airflow path originating at an inlet of the air inlet channel. The airflow path further extends through the equipment room and cabi-
(Continued)

net fan module. A guide plate is also positioned adjacent to an inlet of the equipment room, the guide plate being configured to uniformly distribute the airflow path through the equipment room.

20 Claims, 7 Drawing Sheets

(58) Field of Classification Search
CPC .... H05K 7/20827; H05K 5/0213; H05K 5/00; H05K 5/0217; H05K 7/00; H05K 7/18; H05K 7/20136; H05K 7/20272; H05K 7/20281; H05K 7/20563; H05K 7/20718; H05K 7/20909; H05K 7/20818; G06F 1/20; F24F 11/0001; F24F 11/30; F24F 2221/40; F24F 7/04

See application file for complete search history.

(56) References Cited

U.S. PATENT DOCUMENTS

| | | | | |
|---|---|---|---|---|
| 6,643,130 B1* | 11/2003 | DeMarchis | ........ | H05K 7/20181 361/695 |
| 6,877,551 B2* | 4/2005 | Stoller | .................. | H02B 1/565 165/47 |
| 8,248,793 B2* | 8/2012 | Bash | .................. | H05K 7/20781 361/679.48 |
| 8,254,122 B2 | 8/2012 | Chang | | |
| 8,292,705 B2* | 10/2012 | Matsuzawa | ........ | H05K 7/20563 361/695 |
| 8,606,427 B2* | 12/2013 | Chan | .................. | H05K 7/20836 700/300 |
| 10,306,809 B1* | 5/2019 | Totani | ................ | H05K 7/20836 |
| 11,847,095 B1 | 12/2023 | Bassov | | |
| 12,079,062 B2 | 9/2024 | Li | | |
| 2004/0182799 A1* | 9/2004 | Tachibana | .......... | H05K 7/20572 211/26 |
| 2005/0225936 A1* | 10/2005 | Day | .................. | H05K 7/20745 361/679.47 |
| 2006/0176664 A1* | 8/2006 | Casebolt | .................... | G06F 1/20 361/679.48 |
| 2007/0110255 A1* | 5/2007 | Barath | ............. | G10K 11/17835 381/71.5 |
| 2008/0109670 A1 | 5/2008 | Johansson et al. | | |
| 2009/0255653 A1* | 10/2009 | Mills | .................. | H05K 7/20736 165/104.34 |
| 2010/0077240 A1 | 3/2010 | Daga et al. | | |
| 2010/0317278 A1* | 12/2010 | Novick | .............. | H05K 7/20836 62/401 |
| 2011/0029797 A1 | 2/2011 | Vaden | | |
| 2011/0141838 A1 | 6/2011 | Kishibe | | |
| 2011/0145609 A1 | 6/2011 | Berard et al. | | |
| 2015/0280982 A1 | 10/2015 | Taniuchi | | |
| 2015/0373872 A1* | 12/2015 | Khandelwal | ........ | H05K 7/20572 361/695 |
| 2016/0037685 A1* | 2/2016 | Ross | ..................... | H05K 7/2079 165/104.19 |
| 2016/0105994 A1* | 4/2016 | Hwang | .............. | H05K 7/20745 361/695 |
| 2016/0224082 A1 | 8/2016 | Ohsawa et al. | | |
| 2016/0242323 A1* | 8/2016 | Chen | .................. | H05K 7/20736 |
| 2016/0334861 A1 | 11/2016 | Dang et al. | | |
| 2018/0067539 A1 | 3/2018 | Samson et al. | | |
| 2018/0225066 A1 | 8/2018 | Alavoine et al. | | |
| 2019/0129777 A1 | 5/2019 | Rangarajan | | |
| 2019/0254198 A1* | 8/2019 | Magallanes | ........ | H05K 7/20609 |
| 2020/0192734 A1 | 6/2020 | Kao | | |
| 2020/0257627 A1 | 8/2020 | Chamarty et al. | | |
| 2020/0264005 A1* | 8/2020 | Heo | .................... | G01C 21/3602 |
| 2020/0316581 A1* | 10/2020 | Kaneko | .................... | F24F 3/163 |
| 2022/0171551 A1 | 6/2022 | Adsure et al. | | |
| 2022/0206557 A1 | 6/2022 | Karthikeyan et al. | | |
| 2023/0025554 A1* | 1/2023 | Chen | ....................... | G06F 1/206 |
| 2023/0036737 A1 | 2/2023 | Carbon-Ogden et al. | | |
| 2023/0125240 A1 | 4/2023 | Wang et al. | | |
| 2023/0307030 A1 | 9/2023 | Lu et al. | | |
| 2024/0265903 A1 | 8/2024 | Chen et al. | | |

FOREIGN PATENT DOCUMENTS

| | | |
|---|---|---|
| CN | 216792811 U | 6/2022 |
| CN | 115666083 A | 1/2023 |
| EP | 2754967 A1 | 7/2014 |
| JP | 2000294965 A | 10/2000 |
| TW | 201205252 A | 2/2012 |
| TW | I549600 B | 9/2016 |
| TW | 201732618 A | 9/2017 |
| TW | 202129465 A | 8/2021 |
| TW | 202223883 A | 6/2022 |
| WO | 2012058951 A1 | 5/2012 |

OTHER PUBLICATIONS

Sonoda, Electronic Apparatus Containing Rack and Its Cooling Method, Sep. 27, 2007, JP2007250713 (Year: 2007).*

Klotz et al., Computer Cupboard and Arrangement of a Computer Cupboard, Dec. 19, 2002, WO02101528 (Year: 2002).*

TW Office Action for Application No. 112115549 mailed Jul. 2, 2024, w/ Second Office Action Summary, 8 pp.

TW Search Report for Application No. 112115549 mailed Jul. 2, 2024, w/ Second Office Action, 1 p.

TW Office Action for Application No. 112115544, mailed Jan. 8, 2024, w/ First Office Action Summary, 8 pp.

TW Search Report for Application No. 112115544, mailed Jan. 8, 2024, w/ First Office Action, 1 p.

* cited by examiner

CONTROLLED AIRFLOW DESIGN FOR INDOOR CABINET

TECHNICAL FIELD

The present disclosure relates generally to housing mechanisms for expansion components. More particularly, aspects of this disclosure relate to cabinet assemblies configured to provide cooling capacity and noise reduction for the devices therein.

BACKGROUND

Computer systems (e.g., desktop computers, blade servers, rack-mount servers, etc.) are employed in large numbers in various applications. High demand applications, such as network based systems, data centers, or high density finite element simulations that are able to push hardware of computing systems, require servers with specialized capabilities. Accordingly, modern servers are typically designed to allow flexibility in terms of capabilities and components.

Accordingly, compute architectures have changed over time. For instance, as computing throughputs increase, edge computing has been implemented in an attempt to reduce latency associated with accessing data over networks. Accordingly, servers that were originally located in data centers are being transitioned to user locations. While this design physically shortens the distance data travels, conventional implementations of such servers render them unfeasible at the user locations for other reasons.

Specifically, servers in data centers are designed to operate at a certain performance level. Sacrifices are often made in other areas in an effort to meet these performance capabilities, and as a result, a significant amount of noise is produced as a byproduct. This noise is caused by components like cooling fans operating at incredibly high revolutions per minute (RPMs), and baffling is minimized to increase airflow which further exacerbates the situation. While effective in terms of performance, it is not practical that these conventional servers be implemented in environments having any noise sensitivity, e.g., such as the majority of edge server applications.

Thus, there is a need for a configuration that is able to achieve significant heat dissipation while also minimizing the amount of noise produced as a result. Moreover, these heat and noise reductions must be made despite processing heavy input/output (I/O) loads received from various users, applications, etc.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

An example compute cabinet assembly for providing cooling capacity and noise reduction is disclosed. The compute cabinet assembly includes an equipment room configured to implement electrical components therein, an air inlet channel coupled to a first side of the equipment room, and a cabinet fan module coupled to a second side of the equipment room opposite the first side. A first air outlet channel is coupled to the cabinet fan module and extends along a third side of the equipment room towards a first outlet of the first air outlet channel. Moreover, electric fans are positioned in the cabinet fan module, the electric fans being configured to create an airflow path originating at an inlet of the air inlet channel. The airflow path further extends through the equipment room and cabinet fan module. The airflow path finally exits the compute cabinet assembly at the first outlet. A guide plate is also positioned adjacent to an inlet of the equipment room, the guide plate being configured to uniformly distribute the airflow path through the equipment room.

In some implementations of the example compute cabinet assembly above, the guide plate extends at least as wide as the inlet of the equipment room in direction extending parallel to a longitudinal axis of the inlet of the equipment room. Moreover, in some implementations the guide plate is positioned at an angle relative to an inner surface of the first side of the equipment room. Depending on the specific implementation, the angle at which the guide plate is positioned may be between about 45 degrees and about 90 degrees.

In some implementations the compute cabinet assembly above additionally includes first and second blocking plates. The first blocking plate extends between electrical components implemented in the equipment room and an inner surface of the third side of the equipment room. The second blocking plate extends between the electrical components and an inner surface of a fourth side of the equipment room opposite the third side. In some implementations, a height of the first blocking plate is half a height of the equipment room, and a height of the second blocking plate is also half the height of the equipment room.

In some implementations, a second air outlet channel is coupled to the cabinet fan module and extends along a fourth side of the equipment room towards a second outlet of the second air outlet channel. Moreover, in other implementations the first and second blocking plates are configured to prevent the airflow path from including backflow caused by the electrical components. In certain implementations the electric fans are oriented in a rectangular configuration in the cabinet fan module.

Another example compute cabinet assembly for providing cooling capacity and noise reduction is also disclosed. This compute cabinet assembly includes an equipment room configured to implement electrical components therein, an air inlet channel coupled to a first side of the equipment room, and a cabinet fan module coupled to a second side of the equipment room opposite the first side. A first air outlet channel is also coupled to the cabinet fan module and extends along a third side of the equipment room towards a first outlet of the first air outlet channel. Electric fans are positioned in the cabinet fan module and are configured to create an airflow path originating at an inlet of the air inlet channel. The airflow path further extends through the equipment room and cabinet fan module. Finally, the airflow path exits the compute cabinet assembly at the first outlet. The compute cabinet assembly further includes first and second blocking plates. The first blocking plate extends between electrical components implemented in the equipment room and an inner surface of the third side of the equipment room. The second blocking plate extends between the electrical components and an inner surface of a fourth side of the equipment room opposite the third side.

An example method for providing cooling capacity to a compute cabinet assembly is further disclosed. The method includes causing an airflow path to initiate at an inlet of an air inlet channel coupled to a first side of an equipment room and causing the airflow path to be directed off a guide plate positioned adjacent an inlet of the equipment room. The guide plate is configured to uniformly distribute the airflow path through the equipment room. Moreover, the equipment room includes blocking plates configured to prevent airflow backflow in the equipment room. The method further includes causing the airflow path to extend through the cabinet fan module, in addition to causing the airflow path to exit the compute cabinet assembly at first and second outlets of first and second respective air outlet channels. The first and second air outlet channels are coupled to the cabinet fan module and extend along third and fourth respective sides of the equipment room.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
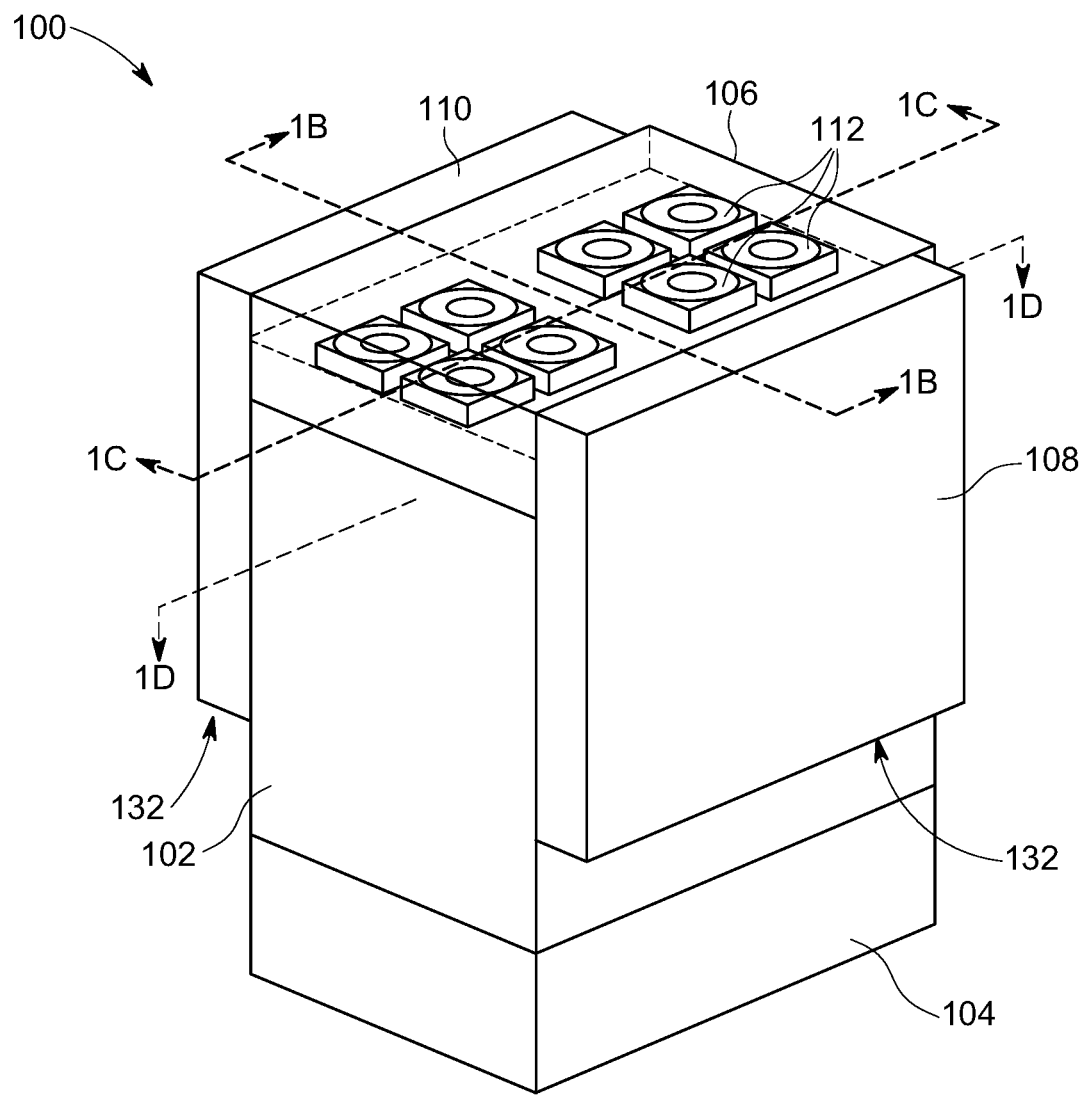
FIG. 1A is a perspective view of a compute cabinet assembly, according to certain aspects of the present disclosure.

The present disclosure is directed toward a compute cabinet assembly for providing cooling capacity and noise reduction. The compute cabinet assembly includes an equipment room configured to implement electrical components therein, an air inlet channel coupled to a first side of the equipment room, and a cabinet fan module coupled to a second side of the equipment room opposite the first side. A first air outlet channel is coupled to the cabinet fan module and extends along a third side of the equipment room towards a first outlet of the first air outlet channel. Moreover, electric fans are positioned in the cabinet fan module, the electric fans being configured to create an airflow path originating at an inlet of the air inlet channel. The airflow path further extends through the equipment room and cabinet fan module. The airflow path finally exits the compute cabinet assembly at the first outlet. A guide plate is also positioned adjacent to an inlet of the equipment room, the guide plate being configured to uniformly distribute the airflow path through the equipment room.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical", "horizontal", "parallel", and "perpendicular" are intended to additionally include "within 3-5% of" a vertical, horizontal, parallel, or perpendicular orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

As previously mentioned, compute architectures have changed over time. For instance, as computing throughputs increase, edge computing has been implemented in an attempt to reduce latency. Accordingly, servers that were originally located in data centers are being transitioned to user locations. While this design physically shortens the distance data travels, conventional implementations of such servers render them unfeasible at the user locations for other reasons.

Specifically, servers in data centers are designed to operate at peak performance, almost disregarding the amount of noise that is produced as a result. Thus, cooling fans are typically run at incredibly high revolutions per minute (RPMs) and baffling is minimized to increase airflow. While effective in terms of performance, these servers simply cannot be implemented in environments having any noise sensitivity. It follows that conventional servers are unsuited for implementation in a variety of settings, including those associated with edge computing.

In sharp contrast to these conventional shortcomings, various ones of the embodiments included herein are able to improve thermal efficiency and noise reduction without inhibiting I/O performance. In other words, the approaches herein are able to reduce the internal temperature and the noise profile of compute cabinet assemblies like edge servers or high performance computing (HPC) servers, e.g., such that they may be place in a wider range of locations having greater noise sensitivities than typical server warehouses. However, this improved thermal transfer and noise reduction does not result in a corresponding reduction in performance typically experienced by conventional implementations. In fact, Inventors have verified with testing, that some of the approaches described herein are able to achieve up to about 8 degrees (Celsius) of heat dissipation along with removing ambient noise caused by the various electric fans and/or electrical components implemented therein. Again, this has been conventionally unachievable.

Figures 1B, 1C:
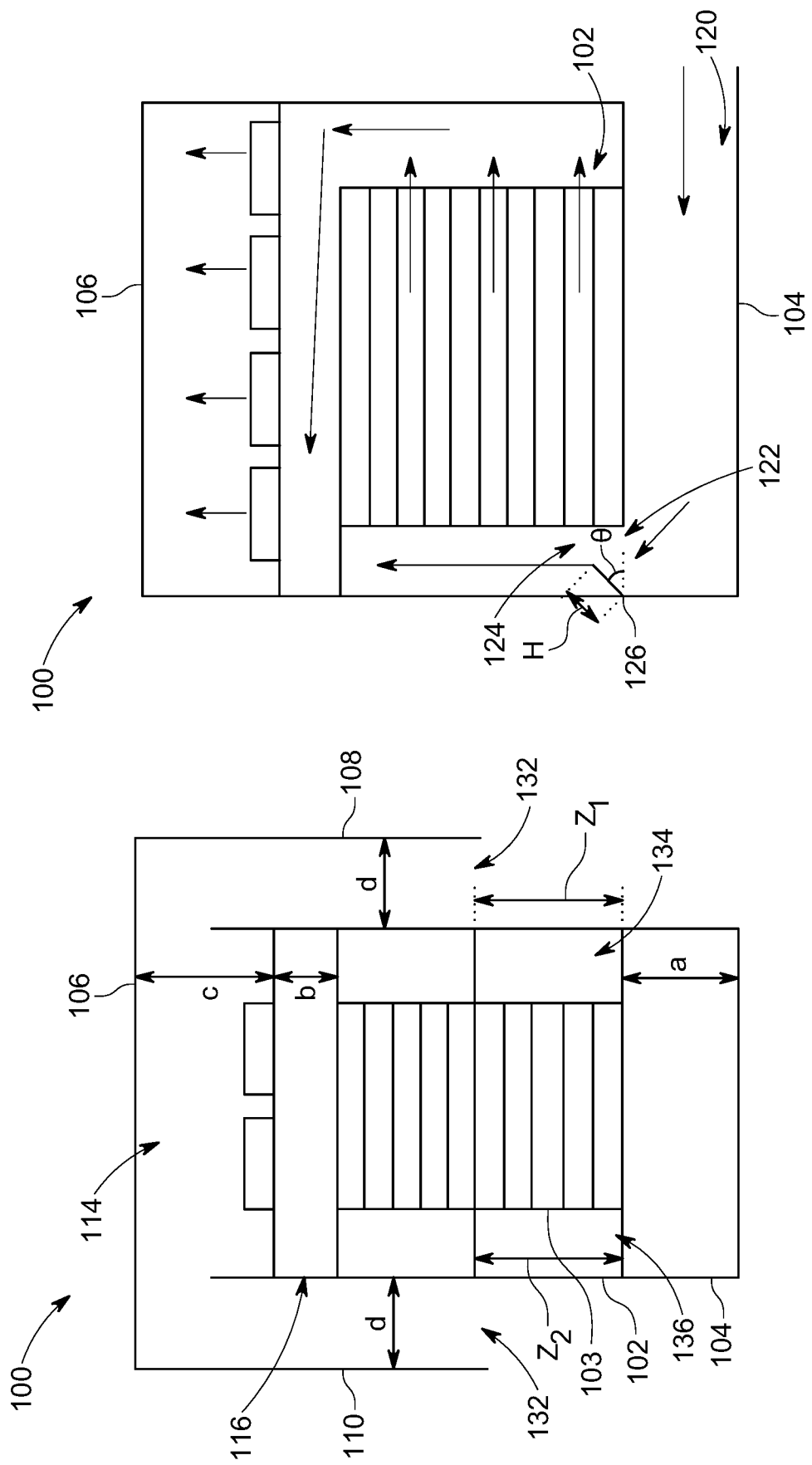
FIG. 1B is a vertical cross-sectional view of the compute cabinet assembly of FIG. 1A, according to certain aspects of the present disclosure.
FIG. 1C is a vertical cross-sectional side view of the compute cabinet assembly of FIG. 1A, according to certain aspects of the present disclosure.

For instance, FIGS. 1A-1C, a compute cabinet assembly 100 that is capable of providing cooling capacity and noise reduction is illustrated in accordance with one embodiment. As an option, the present compute cabinet assembly 100 may be implemented in conjunction with features from any other embodiment listed herein, such as those described with reference to the other FIGS. However, such compute cabinet assembly 100 and others presented herein may be used in various applications and/or in permutations which may or may not be specifically described in the illustrative embodiments listed herein. Further, the compute cabinet assembly 100 presented herein may be used in any desired environment. Thus FIGS. 1A-1C (and the other FIGS.) may be deemed to include any possible permutation.

As shown, the compute cabinet assembly 100 includes an equipment room 102 configured to implement electrical components therein. The equipment room 102 may implement a variety of different electrical components and/or arrangements thereof depending on the implementation. For instance, the equipment room 102 may implement one or more servers in any desired configuration.

According to an example, the compute cabinet assembly 100 serves as an edge computing node. The equipment room 102 may thereby be configured to implement a plurality of edge servers and/or HPC servers therein, even at a user's location. This proximity to a data source allows for the compute cabinet assembly 100 and components therein to provide content caching, service delivery, persistent data storage, etc. As a result, at least some of the implementations included herein are able to achieve faster insights, improved response times, better bandwidth availability, etc., e.g., as will be described in further detail below.

An air inlet channel 104 is also shown as being coupled to a first side of the equipment room 102. Specifically, the air inlet channel 104 is depicted in the present embodiment as being directly coupled to a bottom surface of the equipment room 102, while the compute cabinet assembly 100 is positioned in an intended orientation. The compute cabinet assembly 100 also includes a cabinet fan module 106 coupled to a second side of the equipment room 102. Specifically, the cabinet fan module 106 is illustrated as being coupled directly to a top of the assembly 100. It follows that the air inlet channel 104 and cabinet fan module 106 are positioned on opposite sides of the compute cabinet assembly 100 in some implementations.

First and second air outlet channels 108, 110 are also illustrated as being positioned on opposite sides of the compute cabinet assembly 100. These air outlet channels 108, 110 are also positioned such that at least a portion of the cabinet fan module 106 is coupled thereto. For instance, air outlets of the cabinet fan module 106 may connect directly to respective inlets of the air outlet channels 108, 110. The first and second air outlet channels 108, 110 are thereby preferably configured to direct airflow down the respective sides of the equipment room 102 and away from the cabinet fan module 106, e.g., as shown.

However, the channels 108, 110 may be configured differently depending on the implementation. For instance, the air outlet channels 108, 110 may be positioned on adjacent sides (surfaces) of the compute cabinet assembly 100. In other implementations, the assembly 100 may only include one air outlet channel (e.g., see FIG. 3 below), include three air outlet channels, four air outlet channels, five air outlet channels, etc.

The air inlet channel 104, cabinet fan module 106, and air outlet channels 108, 110 preferably work together (in combination) to allow air to enter the assembly 100. As a result, operating temperatures of the various components inside the assembly 100 may be cooled such that performance efficiency is improved. Moreover, this reduction in temperature does not involve the high noise levels that have plagued conventional implementations. Thus, the compute cabinet assembly 100 may be implemented in a variety of different operating settings without causing undesirable side effects, e.g., as will be described in further detail below.

Looking specifically to FIG. 1C, the air inlet channel 104 is shown as having an inlet 120 that opens to the surrounding environment. The air inlet channel 104 thereby provides a pathway by which ambient air can enter the assembly 100 and travel therethrough. For instance, an airflow path preferably initiates at the inlet 120 of the air inlet channel 104, exits the air inlet channel 104 at an outlet 122 thereof, and enters the equipment room 102 at an inlet 124 thereof. The air carried along the airflow path is thereby able to interact with any compute components implemented in the equipment room 102 and cool them down before passing through the cabinet fan module 106 and exiting the assembly along air outlet channels 108, 110. It is thereby desirable that the air passes through the equipment room 102 in a substantially uniform manner. As a result, each of the compute components are cooled at a similar rate, thereby ensuring that the compute cabinet assembly 100 remains operational.

While the air carried along the airflow path may enter the equipment room 102 through an arbitrary opening (e.g., inlet 124) in some implementations, the air carried along the airflow path may transition through the equipment room 102 more desirably (e.g., uniformly) in response to certain dimensions and/or features being implemented at the inlet 124 to the equipment room 102. For instance, the inlet 124 of the equipment room 102 is shown in FIG. 1C as including a guide plate 126. In preferred implementations, the guide plate 126 is positioned adjacent to an inlet 124 of the equipment room 102. As noted above, this allows for air carried along the airflow path to travel through the equipment room 102 more uniformly, thereby causing better heat dissipation, improved operating conditions (e.g., a higher achievable processing throughput) for the assembly 100, etc.

Absent the guide plate 126, a non-uniform airflow distribution forms, causing each electrical component to experience a different airflow flowrate. Moreover, added flow resistance at the outlets of the electrical components results in backflow, e.g., as will be described in further detail below.

It follows that the guide plate 126 is preferably configured to uniformly distribute (e.g., direct, disperse, etc.) airflow path through the equipment room 102. In other words, the guide plate 126 is preferably designed to alter the airflow path at the inlet 124 of the equipment room 102 such that each of the electrical components 103 in the equipment room 102 receive about a same airflow flowrate (e.g., airflow potential). Moreover, while some changes to airflow path create airflow resistance and reduce the total achievable airflow, implementing the guide plate 126 was found to have almost no impact on the total achievable airflow for the assembly 100.

For instance, the guide plate 126 may be positioned at an angle "θ" relative to an inner surface of the side of the equipment room coupled to the air inlet channel 104. The angle θ at which the guide plate 126 is oriented impacts the airflow path of the air as it passes through the equipment room 102. In other words, the guide plate 126 may be adjusted to achieve the desired airflow path for the specific equipment room and/or electrical components implemented therein. For instance, the guide plate 126 may be positioned at an angle θ of between about 45 degrees and about 90 degrees, but could be higher or lower depending on the particular approach.

The dimensions of the guide plate 126 may also vary depending on the approach. For instance, referring momentarily to the top-down view of the equipment room 102 in the compute cabinet assembly 100 depicted in FIG. 1D, the guide plate 126 is shown as extending at least as wide as the inlet 124 of the equipment room 102 along a direction 130 extending parallel to a longitudinal axis of the inlet 124 of the equipment room 102. In other words, the width "W" of the guide plate 126 is about as wide as the inlet 124 of the equipment room 102, as measured along direction 130. Similarly, the width W of the guide plate 126 is about as wide as the airflow path. According to an illustrative range, which is in no way intended to limit the invention, the width of the guide plate 126 may be from about 100 millimeters (mm) to about 800 mm, but the width could be wider or narrower depending on the implementation.

Having the guide plate 126 extend at least as wide as the inlet 124 of the equipment room 102 desirably ensures that all (or at least a majority) of the air that enters the equipment room 102 through the inlet 124 is directed by the guide plate 126. The resulting airflow path that passes through the equipment room 102 is able to significantly reduce the internal temperature thereof. For instance, by ensuring air passes through each (or at least a majority) of the electrical components implemented in the equipment room 102, the airflow path is able to continually remove thermal energy from the equipment room 102 such that the assembly 100 as a whole is able to operate more efficiently.

Figure 1D:
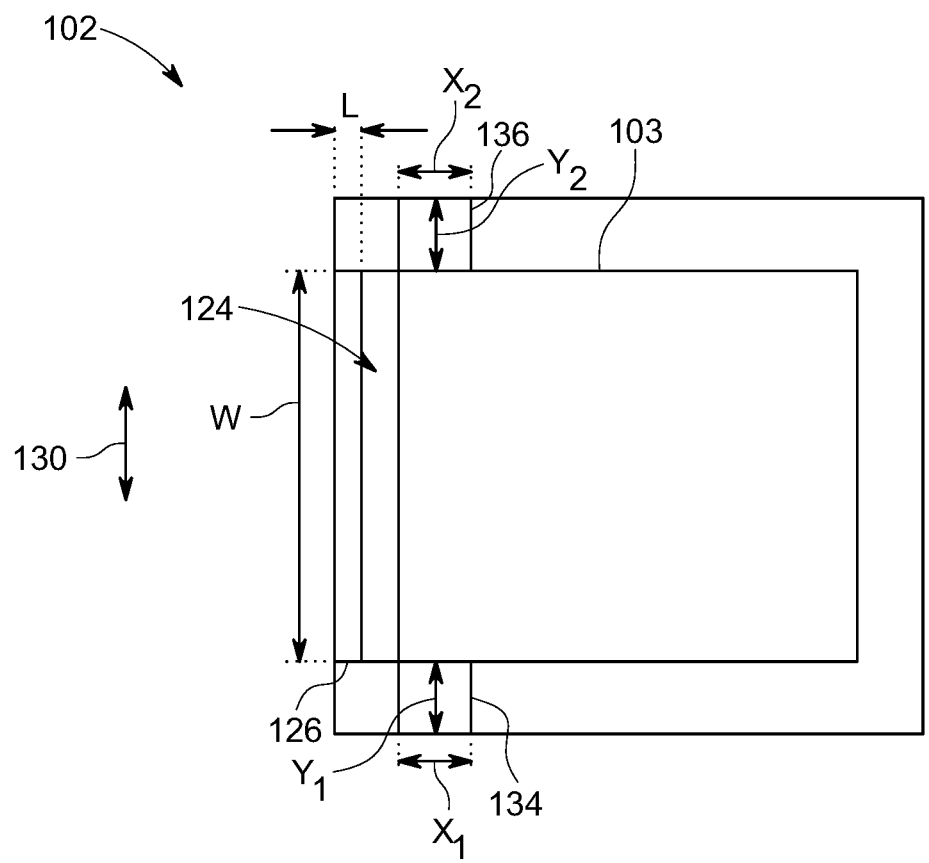
FIG. 1D is a horizontal cross-sectional top-down view of the equipment room of FIG. 1A, according to certain aspects of the present disclosure.

Moreover, the length "L" and height "H" of the guide plate 126 (as seen in FIGS. 1D and 1C, respectively) may also vary depending on the approach. For instance, the length L of the guide plate 126 may be between about 0.1 mm and about 20 mm, but could be longer or shorter depending on the implementation. The height H of the guide plate 126 may be between about 44.5 mm and about 445 mm in some implementations, but the guide plate 126 may have a higher or lower height in various other implementations.

The guide plate 126 may be formed using one or more materials, e.g., depending on the implementation. For instance, the guide plate 126 may have a body formed using one or more of plastic(s), metal(s), ceramic(s), wood(s), synthetic(s), etc. The guide plate 126 may thereby be designed for specific implementations or general use. For example, the guide plate may be made from a material that acts as a heat sink which absorbs heat for the equipment room 102 and transfers it outside the assembly 100.

In addition to the guide plate 126, the equipment room 102 includes first and second blocking plates 134, 136. For instance, looking to the cross-sectional view in FIG. 1B, the first blocking plate 134 is shown as extending between a first side of electrical components 103 implemented in the equipment room 102 and an inner surface of the side of the equipment room adjacent air outlet channel 108. The second blocking plate 136 is also shown as extending between a second side of the electrical components 103 and an inner surface of the side of the equipment room adjacent air outlet channel 110. The first and second blocking plates 134, 136 are also seen in the top-down view of FIG. 1D.

As noted above the first and second blocking plates 134, 136 are used to reduce airflow backflow. The airflow backflow may be caused by several different contributing factors. For instance, the airflow backflow may be caused by the electrical components, the geometry of the interior of the assembly 100, air speeds, etc. For instance, referring still to the top-down view of FIG. 1D, the first and second blocking plates 134, 136 are shown as separating the inlet 124 of the equipment room 102 from the opposite end of the electrical components 103. Thus, as hot air that has absorbed some of the thermal energy produced by the electrical components 103 exits the electrical components 103, it is urged towards the outlet of the equipment room 102 rather than back towards the inlet 124. It follows that without the first and/or second blocking plates 134, 136, the compute cabinet assembly 100 would have much more limited thermal regulation capabilities.

The first and second blocking plates 134, 136 are also able to prevent airflow bypass at the entrances of the electrical components 103. In some instances, the air resistance is less to travel around the electrical components 103 than through them. Accordingly, the first and second blocking plates 134, 136 act to funnel air incoming along the airflow path towards and through the electrical components 103.

The widths $Y_1$, $Y_2$ of the respective blocking plates 134, 136 may be the same, similar, or different depending on the approach. For instance, in some approaches the blocking plates 134, 136 may have the same widths $Y_1$, $Y_2$ to seal either side of the electrical components 103. However, in some instances the electrical components may not be implemented symmetrically inside the equipment room, thereby causing the blocking plates 134, 136 to have different widths. According to an illustrative range, the widths of the first and/or second blocking plates 134, 136 may be between about 1 mm and about 200 mm, but the widths could actually be larger or smaller measurements in some implementations (e.g., depending on the other dimensions of the first and/or second blocking plates 134, 136).

Similarly, the lengths $X_1$, $X_2$ of the respective blocking plates 134, 136 may be the same, similar, or different depending on the approach. For instance, in some approaches the blocking plates 134, 136 may have the same lengths $X_1$, $X_2$ to implement a similar style of thermal barrier on either side of the electrical components 103. However, the blocking plates 134, 136 may have different lengths. According to an illustrative range, the lengths $X_1$, $X_2$ of the first and/or second blocking plates 134, 136 may be between about 0.1 mm and about 400 mm, but the lengths could actually be larger or smaller measurements in some implementations (e.g., depending on the other dimensions of the first and/or second blocking plates 134, 136).

Looking back now to FIG. 1B, the blocking plates 134, 136 are also shown as only extending partially along the side of the electrical components 103. In other words, an overall height of the electrical components 103 in the equipment room 102 may be significantly higher than heights $Z_1$, $Z_2$ of the blocking plates 134, 136 measured in the same direction. For example, the blocking plates 134, 136 may have heights $Z_1$, $Z_2$ that measure from about 222.5 mm to a height that is less than the total height of the electrical components 103 therein. In some implementations, the blocking plates 134, 136 may have heights $Z_1$, $Z_2$ that measure half the overall height of the equipment room 102 and/or electrical components 103 included therein. However, this is in no way intending to be limiting. For instance, in other implementations, the blocking plates 134, 136 may have heights $Z_1$, $Z_2$ that measure equal to the overall height of the equipment room 102 and/or the electrical components 103.

The inventors discovered that airflow backflow increases towards the bottom of the equipment room 102 (e.g., towards the air inlet channel 104). Thus, by positioning the blocking plates 134, 136 towards the "bottom" of the equipment room 102, airflow backflow is minimized while leaving a reminder of the equipment room 102 open to allow for a desirable airflow path strength. In other words, testing revealed that a non-uniform flow field was formed, causing airflow backflow that increased towards the bottom of the equipment room. By implementing one or more blocking plates 134, 136 having designs that focus on these areas experiencing airflow backflow, the flow field of the assembly 100 as a whole is improved as a result. Moreover, the blocking plates 134, 136 may include any desired type of material(s), e.g., such as one or more plastic(s), metal(s), ceramic(s), wood(s), synthetic(s), etc.

It follows that various ones of the implementations included herein are able to significantly improve characteristics of the airflow path that is formed in the assembly 100. This desirably improves thermal regulation and allows for the electrical components included therein to operate in a wider range of activation states without creating an undesirably high internal temperature of the compute cabinet assembly 100. The electrical components 103 in the equipment room are thereby able to operate as needed rather than in a throttled manner as seen in conventional implementations that have been unable to achieved similar results to the various approaches included herein.

In some implementations, these improvements to airflow path characteristics are formed by the guide plate 126 as well as blocking plates 134, 136. These features improve the airflow path inside the compute cabinet assembly 100, especially in the equipment room 102. Specifically, some implementations are able to achieve uniform airflow distribution across all electrical components 103 implemented in the equipment room 102 by implementing the guide plate 126. Moreover, some implementations are able to prevent backflow from occurring in the equipment room 102 by implementing one or more blocking plates 134, 136. As a result, the inside of the equipment room 102 is the operational equivalent of running each of the electrical components 103 unprotected (e.g., in the free air). In other words, the electrical components 103 are provided exceptional airflow in the equipment room 102. This allows the electrical components 103 to operate as desired without becoming thermally unstable by reducing the internal temperature of the equipment room 102 and the electrical components 103 therein at least 8 degrees Celsius compared to internal temperatures for implementations that do not include the guide plate 126 or the blocking plates 134, 136. While both the guide plate 126 and the blocking plates 134, 136 both improve the thermal performance of the assembly 100, the guide plate 126 may have a greater effect on the thermal performance than the blocking plates 134, 136. However, this is in no way intended to be limiting.

While the compute cabinet assembly 100 is depicted in FIGS. 1A-1D as having a guide plate 126 in addition to two blocking plates 134, 136, this is in no way intended to be limiting. Rather, a compute cabinet assembly may include any desired combination of these components, and they may have desired dimensions and/or material compositions. For example, a compute cabinet assembly may implement a guide plate in addition to a single blocking plate, while other compute cabinet assemblies may implement only a guide plate. Still other compute cabinet assemblies may not implement a guide plate at all, but rather include two blocking plates. The components described herein may thereby be implemented in different combinations and/or configurations to achieve the thermal regulation characteristics that are desired for the given implementation.

It follows that, in combination with the guide plate 126 and the blocking plates 134, 136, the air inlet channel 104 is preferably designed to allow for a desired amount (e.g., volume) of air to enter an interior of the assembly 100. This desired amount of air may vary depending on the number of components included in the assembly 100, the intended use of the assembly 100, a size of the assembly 100, the interior configuration(s) of the assembly 100, etc. The dimensions of the various portions of the compute cabinet assembly 100 may thereby also vary depending on the implementation. For instance, the dimensions and/or orientation angle of the guide plate 126 may be calibrated based on the amount (e.g., volume) of air the air inlet channel 104 is configured to provide the inlet of the equipment room 102. Similarly, the dimensions and/or number of blocking plates 134, 136 included in a given implementation may be adjusted based on the amount (e.g., volume) and direction of the air as it passes through the equipment room 102 along the airflow path.

For instance, FIG. 1B indicates a number of specific dimensions that may be adjusted, e.g., to produce the desired amount of airflow through the assembly 100. These dimensions may be "adjusted" in the sense that they can be set during manufacture of the physical assembly 100 and its various portions. As shown, the width "d" of the air outlet channels 108, 110 may be adjusted to control an amount of air that leaves the assembly 100. According to an exemplary range, the width "d" of either air outlet channel 108, 110 may be between about 8.89 centimeters (cm) and about 26.67 cm, but could be higher or lower as desired. Moreover, the air outlet channels 108, 110 may have the same, similar, or different dimensions depending on the approach. Furthermore, the height "a" of the air inlet channel 104 may be between about 13.34 cm and about 31.12 cm, but could be higher or lower depending on the desired implementation.

The cabinet fan module 106 is shown as being divided into a first section 114 and a second section 116. The first section 114 includes the plurality of electric fans 112, while the second section 116 is adjacent thereto. The second section 116 allows for air to fully exit the equipment room 102 and be drawn in by each of the electric fans 112. It follows that the dimensions of the first and second sections 114, 116 impacts airflow through the whole assembly 100. For instance, the height "c" of the first section 114 of the cabinet fan module 106 may also be adjusted. By adjusting the height "c" of the first section 114, the electric fans 112 may be able to create more or less air pressure, thereby leading to larger or smaller airflows, respectively. According to another exemplary range, the height "c" of the first section 114 of the cabinet fan module 106 may be between about 4.45 cm and about 17.78 cm. Moreover, the height "b" of the second section 116 may be adjusted to allow for more or less air to be provided to the various electric fans 112. According to an exemplary range, the height "b" of the second section 116 of the cabinet fan module 106 may be between about 4.45 cm and about 17.78 cm.

While certain dimensions have been indicated in FIG. 1B, these are in no way intended to be limiting. Any other dimensions or aspects of the compute cabinet assembly 100 may be adjusted as desired. It should also be noted that the relative orientation of the dimensions described with respect to FIG. 1B are in no way intended to be limiting. Thus, while dimension "a" is described above as a height, this is in no way intended to limit the invention. For example, if the air inlet channel were to be implemented in a different orientation, position, environment, etc., the dimension "a" may be referenced as a width, thickness, length, etc., or any other equivalent measurement.

The inlet 120 of the air inlet channel 104 may be free of any obstructions in some approaches. In other words, the inlet 120 of the air inlet channel 104 may be configured to permit a maximum amount of air into the assembly 100. In other approaches however, the inlet 120 of the air inlet channel 104 may implement an air filter configured to remove contaminates from the ambient air that is drawn into the assembly 100 and/or some other type of component that at least partially blocks airflow from entering. An outlet 122 of the air inlet channel 104 may also be configured differently depending on the approach.

As noted above, the outlet 122 of the air inlet channel 104 opens directly to the equipment room 102. The guide plate 126 is also positioned adjacent to the inlet 124 of the equipment room 102. Ambient air taken in by the air inlet channel 104 is thereby allowed to enter and pass through the equipment room 102. As noted above, this allows for the various electrical components included in the equipment room 102 to operate without overheating by achieving a thermal exchange with the air being passed through the electrical components, e.g., as would be appreciated by one skilled in the art after reading the present description. Moreover, the blocking plates 134, 136 maintain a desirable airflow path by removing airflow backflow therefrom. As noted above, by preventing air to feed back to the inlet 124, thermal efficiency would significantly decrease, causing the achievable throughput of the assembly 100 as a whole (and electrical components 103 included therein) to be limited.

For instance, looking again specifically to FIG. 1C, the arrowed lines demonstrate that ambient air is drawn into the air inlet channel 104 before entering the equipment room 102. There, the ambient air flows through each of the electrical components and/or physical bays that are configured to implement (e.g., hold) the various electrical components of the equipment room 102. Heat generated by the electrical components in the equipment room 102 may thereby be transferred to the cooler ambient air passing through, before being carried into the cabinet fan module 106. There, heat generated by the electric fans 112 and/or any other electrical components in the cabinet fan module 106 may also be absorbed before eventually exiting through outlets of the cabinet fan module 106, each outlet being connected (e.g., aligned and functionally coupled to) inlets of the air outlet channels 108, 110. The heat from the equipment room 102 and/or cabinet fan module 106 is removed from the assembly 100 at outlets of the air outlet channels 108, 110. The inlets and the outlets of the air outlet channels 108, 110 are thereby configure the airflow path such that airflow is directed from the first and second air outlet channels 108, 110 to the respective sides of the equipment room 102 and away from the cabinet fan module 106.

It may also be desirable that the assembly 100 is implemented in environments having a lower ambient temperature than an average operating temperature in the equipment room 102. In other words, the assembly 100 is preferably able to draw in ambient air that has a lower temperature than the air in the equipment room 102, e.g., during operation of the electrical components therein and/or the electric fans 112. In some implementations, the assembly 100 may even be configured to condition (e.g., cool, dehumidify, etc.) air before it is used to cool the temperature in the equipment room, and thereby the electrical components therein.

Electric fans 112 positioned in the cabinet fan module 106 are used to at least partially generate the airflow that passes through the compute cabinet assembly 100. In other words, the electric fans are preferably configured to create airflow originating at the inlet 120 of the air inlet channel 104, extending through the equipment room 102 and cabinet fan module 106, finally exiting the compute cabinet assembly 100 at the outlets 132 of the first and second air outlet channels 108, 110. As noted above, in some implementations the electric fans 112 are controlled by a processor or other type of computing device (e.g., a controller) to create this airflow. Accordingly, the electric fans 112 may be turned on to create the airflow, or off to stop the airflow by a processor determining to supply the electric fans 112 with a supply voltage. In other implementations, the electric fans 112 may receive instructions from a processor, and these instructions may be implemented in the electric fan 112 by a processor (e.g., microcontroller) included therein that controls a motor of the electric fan 112 to turn the unit as a whole on to create the airflow, or off to stop the airflow.

For instance, the positive and negative pressures formed by the electric fans 112 while operating (e.g., rotating) create a bias that draws ambient air in through the air inlet channel 104, pushes the ambient air through the equipment room 102, and out through the air outlet channels 108, 110. The orientation and/or amplitude of the air pressures formed by the electric fans 112 may be selectively adjusted by changing the dimensions (e.g., pitch, length, thickness, etc.) of the physical blades in the electric fans 112, the operating speed of the electric fan(s) 112, the orientation of the electric fans 112, the direction in which blades of the electric fans 112 rotate, etc. It follows that the specific amount of airflow that is desired for a given situation may be achieved.

According to a specific example, which is in no way intended to limit the invention, the compute cabinet assembly 100 functions as an edge server, a HPC server, or any other type or server that would be apparent to one skilled in the art. Over time, this server may be faced with different workloads and therefore will be throttled between different throughput levels, causing the electrical components therein to experience a range of operating settings. The operating speed of the electric fans 112 may thereby be ramped up and down to achieve a sufficient airflow for the electrical components in the compute cabinet assembly 100 to be cooled properly while also reducing power consumption and operating noise.

The electric fans 112 may thereby communicate with one or more sensors positioned throughout the compute cabinet assembly 100. For instance, temperature sensors may be positioned throughout the equipment room 102 and relay temperature-based information to a processor that controls the operating settings of the various electric fans 112. Similarly, temperature sensors positioned in the air inlet channel 104 may identify the temperature of the incoming ambient air which indicates the cooling capacity of the ambient air. The operating settings of the electric fans 112 may thereby be adjusted based on how effective the ambient air is at absorbing heat from the equipment room 102, e.g., as would be appreciated by one skilled in the art after reading the present description.

It follows that depending on the configuration and/or operating settings of the electric fans 112, they may produce a significant amount of noise and/or turbulence along the airflow path in some situations. As noted above, conventional implementations have been unable to reduce improve thermal regulation without sacrificing performance capabilities. In sharp contrast, various ones of the implementations included herein are able to maintain high amounts of thermal capacity without impacting performance levels.

Moreover, some implementations can significantly reduce the amount of noise that is produced by the assembly 100 as a whole. These acoustic improvements are achieved at least in part by the relative positions of the various portions of the compute cabinet assembly 100. For instance, by positioning the equipment room 102 towards a center of the assembly 100 with the air inlet channel 104, cabinet fan module 106, and air outlet channels 108, 110 generally surrounding it, the noise produced by the electrical components (e.g., servers) in the equipment room 102 and the electric fans 112 are confined within the assembly 100 and absorbed before entering the surrounding environment. Accordingly, it is desirable that the air outlet channels 108, 110 are partially coupled to the cabinet fan module 106 and extend along the sides of the equipment room towards the outlets 132.

With continued reference to FIGS. 1A-1D, the acoustic profile of the compute cabinet assembly 100 may further be improved by implementing one or more noise absorbing barriers and/or noise isolation barriers. A noise absorbing barrier is preferably configured to at least partially absorb sound (i.e., soundwaves) produced by components in the assembly 100. This may be accomplished by converting some of the energy in the audible noise to heat that is absorbed. Accordingly, it may be advantageous to place noise absorbing barriers near entrances and exits of the compute cabinet assembly 100 to prevent noise from exiting. For example, noise absorbing barriers may be applied to one or more interior surfaces of the air inlet channel 104 and/or the air outlet channels 108, 110.

On the other hand, a noise isolation barrier (e.g., noise insulation) may be used to restrict sound from travelling between separate spaces through shared surfaces, e.g., such as walls, ceilings, floors, etc. Accordingly, it may be advantageous to place noise isolation barriers near noise sources in the compute cabinet assembly 100 to prevent noise from escaping from these specific portions or compartments. For example, noise isolation barriers may be applied to one or more interior surfaces of the equipment room 102 and/or the air outlet channels 108, 110.

Figure 2A:
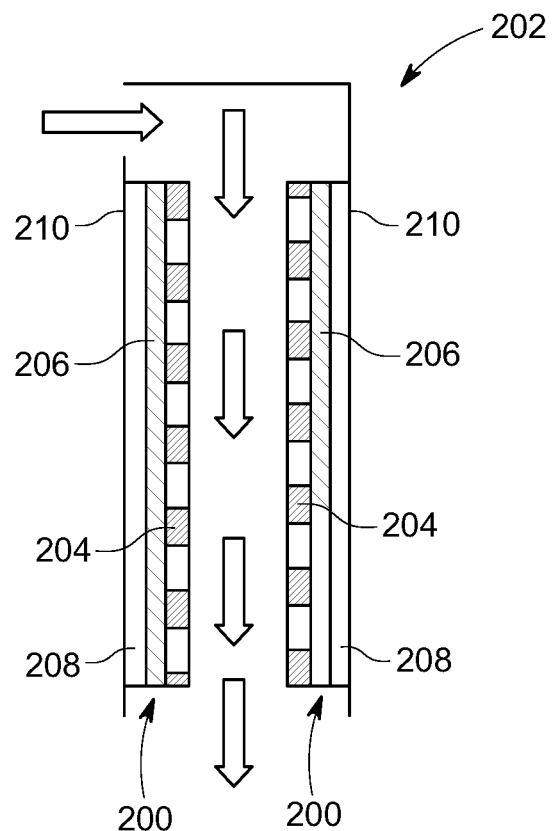
FIG. 2A is a cross-sectional view of a channel having air absorbing barriers applied to interior surfaces thereof, according to certain aspects of the present disclosure.
Figure 2B:
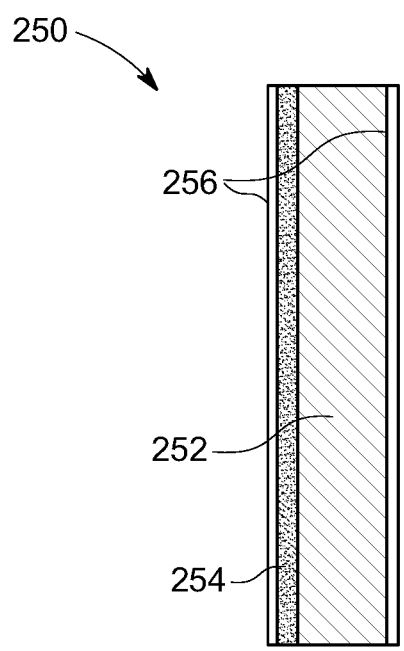
FIG. 2B is a cross-sectional view of an air isolation barrier, according to certain aspects of the present disclosure.

Referring momentarily now to FIGS. 2A-2B, noise absorbing barriers 200 and a noise isolation barrier 250 are illustrated in accordance with certain embodiments. As an option, the present barriers 200, 250 may be implemented in conjunction with features from any other embodiment listed herein, such as those described with reference to the other FIGS., such as FIGS. 1A-1C. However, such barriers 200, 250 and others presented herein may be used in various applications and/or in permutations which may or may not be specifically described in the illustrative embodiments listed herein. Further, the barriers 200, 250 presented herein may be used in any desired environment. Thus FIGS. 2A-2B (and the other FIGS.) may be deemed to include any possible permutation.

Looking specifically to FIG. 2A, the noise absorbing barriers 200 are illustrated as being positioned on opposite sidewalls (e.g., sides) of a channel 202. Accordingly, the noise absorbing barriers 200 may be applied to all interior surfaces of a given component. For instance, noise absorbing barriers 200 may be applied to all interior surfaces of air inlet and/or outlet channels.

A noise absorbing barrier 200 includes a plate layer 204 coupled to a noise absorbing layer 206. In some implementations, the plate layer 204 may be coupled directly to the noise absorbing layer 206. In other words, there may not be any intermediate layers positioned between the plate layer 204 and the noise absorbing layer 206. Despite not having any intermediate layers therebetween, the plate layer 204 and noise absorbing layer 206 may be directly coupled to each other using one or more adhesives applied to coupled surfaces of the respective layers 204, 206. In other approaches, the plate layer 204 may be coupled to the noise absorbing layer 206 using one or more fasteners, clamps, brackets, magnets, etc.

The plate layer 204 is preferably a perforated plate having a plurality of holes extending therethrough. In other words, the plate layer 204 includes a piece of material (e.g., metal) having different hole sizes, shapes, patterns, etc., that have been formed through the piece of material. For example, the plate layer 204 may include material having evenly spaced holes formed therethrough, the holes having an inner diameter of between about 0.01 mm and about 10 mm, but could be higher or lower. Depending on the approach, these holes may have been formed manually, mechanically (e.g., stamped or punched), using laser cutting, etc. Accordingly, the plate layer 204 is depicted in FIG. 2A as having alternating crosshatching to indicate the various holes that extend through the layer 204.

Depending on the approach, the plate layer 204 may include aluminum, steel, stainless steel, gypsum, etc., or another type of desired material. The noise absorbing layer 206 may also include different materials depending on the implementation. For instance, the noise absorbing layer 206 may include foam, rockwool, glasswool, etc., or any other type of material that is able to absorb sound (e.g., convert sound into heat) and which would be apparent to one skilled in the art after reading the present description.

The noise absorbing layer 206 is further separated from the outer noise isolation layer 210 of the channel 202 by an air layer 208. In some approaches, the air layer 208 is enclosed (e.g., sealed) such that air is trapped in a confined volume between the noise absorbing layer 206 and the outer noise isolation layer 210. The air included in an enclosed air layer may include specific gasses (e.g., molecules), be pressurized, kept at a predetermined temperature, etc. In other approaches, the air layer 208 is not enclosed (e.g., is open), allowing for air to pass therethrough.

While the plate layer 204 in combination with the noise absorbing layer 206 and air layer 208 significantly reduce noise, the noise isolation layer 210 may serve to further prevent any remaining noise from escaping through the sidewalls of the channel 202. Accordingly, the noise isolation layer 210 preferably includes a type or rubber, e.g., such as ethylene propylene diene monomer (EPDM), or any other material that is capable of effectively blocking (e.g., insulating) soundwaves from passing therethrough. The noise isolation layer 210 may also have a thickness of between about 1 mm and about 3 mm, but could be higher or lower depending on the approach.

It should also be noted that while the noise absorbing barrier 200 is illustrated in FIG. 2A as having the above configuration, this is in no way intended to be limiting. For instance, in other implementations, a noise absorbing barrier may include only a noise absorbing layer and a noise isolation layer. In other implementations, a noise absorbing barrier may include a noise isolation layer separated from a patterned plate layer by an air barrier. In still other implementations, a noise absorbing barrier may include a noise isolation layer, separated from a patterned plate layer by a noise absorbing layer. It follows that various combinations of the layers described herein may be combined to create various structures that may be used to coat the surfaces of compute cabinet assemblies as desired.

Looking now to FIG. 2B, the noise isolation barrier 250 includes a noise absorbing layer 252, and a noise isolation layer 254, these layers 252, 254 being sandwiched between outer walls 256. In some implementations, the noise absorbing layer 252 and noise isolation layer 254 may be coupled directly to each other. In other words, there may not be any intermediate layers positioned between the noise absorbing layer 252 and noise isolation layer 254. Despite not having any intermediate layers therebetween, the noise absorbing layer 252 and noise isolation layer 254 may be directly coupled to each other using one or more adhesives applied to coupled surfaces of the respective layers 252, 254. In other approaches, the noise absorbing layer 252 may be coupled to and noise isolation layer 254 using one or more fasteners, clamps, brackets, magnets, etc.

The noise absorbing layer 252 and noise isolation layer 254 may further implement any of the approaches above with respect to layers 206 and 210, respectively. Accordingly, the noise absorbing layer 252 may include foam, rockwool, glasswool, etc., or any other type of material that is able to absorb sound (e.g., convert sound into heat) and which would be apparent to one skilled in the art after reading the present description. The noise isolation layer 210 may include a type or rubber, or any other material that is capable of effectively blocking (e.g., insulating) soundwaves from passing therethrough. Moreover, the outer walls 256 may include any desired type of metal, plastic, etc.

It follows that the barriers depicted in FIGS. 2A-2B are desirably able to reduce the amount of noise that is in a given environment. For instance, applying noise absorbing barriers and/or noise isolation barriers to the surfaces of a compute cabinet assembly (e.g., see 100 of FIG. 1A-1C) significantly reduces the amount of noise that escapes from inside the assembly. These barriers may also be applied to the various surfaces of the assembly differently depending on the implementation. Referring momentarily back to FIGS. 1A-1C, in some implementations the noise absorbing barriers and the noise isolation barriers are applied to at least one surface of the equipment room 102, more preferably at least one interior surface of the equipment room 102, more preferably still all interior surfaces of the equipment room 102.

In other implementations, the noise isolation barriers are applied all interior surfaces of the equipment room 102, while a noise absorbing barrier is applied to one exterior surface of the equipment room 102. In other implementations the noise absorbing barriers and the noise isolation barriers are both applied to at least one surface of the cabinet fan module 106, more preferably at least one interior surface of the cabinet fan module 106, more preferably still all interior surfaces of the cabinet fan module 106. In still other implementations the noise absorbing barriers and the noise isolation barriers are both applied to all interior surfaces of the cabinet fan module 106 and the equipment room 102, while noise absorbing barriers are applied to all interior surfaces of the air inlet channel 104 and air outlet channels 108, 110.

This allows for compute devices like edge servers and HPC servers to be positioned in environments that are sensitive to noise, which has been conventionally unachievable without significantly reducing throughput of the computing device. However, embodiments included herein introduce implementations that are able to maintain desired airflow while also significantly reducing the noise footprint of the resulting system.

It should again be noted that while various portions of the compute cabinet assembly 100 have been depicted and/or described as being coupled to certain surfaces of the equipment room 102, this is in no way intended to be limiting. Rather, the different portions of the assembly may be implemented (e.g., positioned) differently. For instance, the air inlet channel 104 is depicted in the present embodiment as being directly coupled to a "bottom" surface of the equipment room 102 when positioned in an intended orientation. However, this is in no way intended to be limiting. The air outlet channels 108, 110 may be coupled to "top" and "bottom" surfaces of the assembly 100 while positioned in an intended orientation, and the air inlet channel 104 and cabinet fan module 106 positioned on opposite sides of the assembly 100 while in the same orientation.

Figure 3:
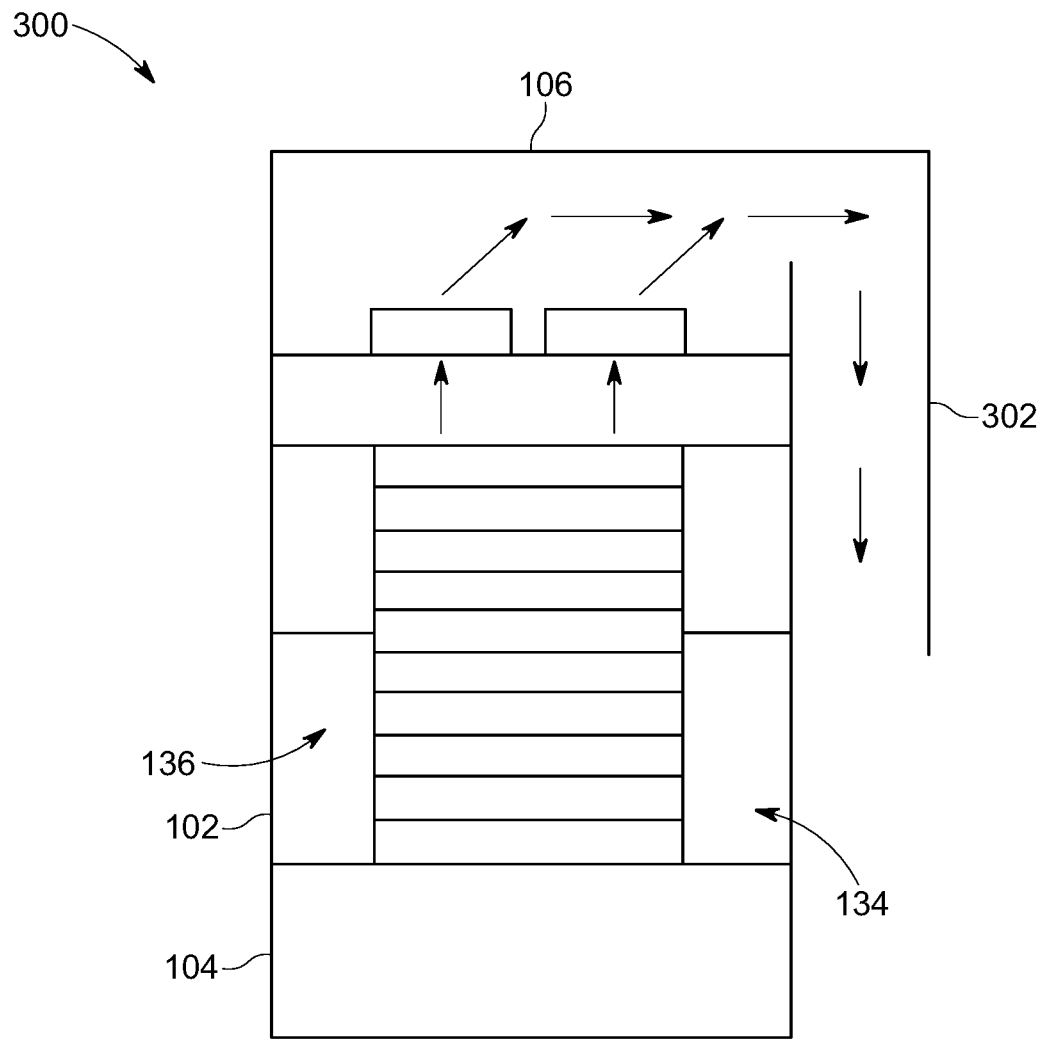
FIG. 3 is a vertical cross-sectional view of a compute cabinet assembly, according to certain aspects of the present disclosure.

Similarly, the number of portions the compute cabinet assembly 100 is shown as including is in no way intended to be limiting. For instance, in some implementations a compute cabinet assembly includes only one air outlet channel. Looking now to FIG. 3, a compute cabinet assembly 300 that provides cooling capacity and noise reduction is illustrated in accordance with one embodiment. Specifically, FIG. 3 illustrates a variation of the embodiment of FIGS. 1A-1C depicting an exemplary configuration of the air outlet channel 302. Accordingly, various components of FIG. 3 have common numbering with those of FIGS. 1A-1C, e.g., such as first and second blocking plates 134, 136.

As shown, the compute cabinet assembly 300 includes the equipment room 102 which is configured to implement electrical components therein. The air inlet channel 104 is also shown as being coupled to a first side of the equipment room 102. The compute cabinet assembly 300 also includes the cabinet fan module 106 coupled to a second side of the equipment room 102. Specifically, the cabinet fan module 106 is illustrated as being coupled directly to a top of the assembly 100. It follows that the air inlet channel 104 and cabinet fan module 106 are positioned on opposite sides of the compute cabinet assembly 300.

However, only one air outlet channel 302 is illustrated in the present implementation as being coupled to a side of the equipment room 102. This air outlet channel 302 is also positioned such that at least a portion of the cabinet fan module 106 is coupled thereto. For instance, an air outlet of the cabinet fan module 106 may connect directly to an inlet of the air outlet channel 302. The air outlet channel 302 is thereby preferably configured to direct airflow down the side of the equipment room 102 and away from the cabinet fan module 106, e.g., as shown.

As noted above, noise absorbing barriers and/or noise isolation barriers may also be coupled to any desired surfaces of these various portions of the assembly 300. For instance, noise absorbing barriers may be applied to all interior surfaces of the air inlet channel, the air outlet channel, the equipment room, and the cabinet fan module. Moreover, noise absorbing barriers may also be applied to all interior surfaces of the equipment room, and the cabinet fan module.

Figure 4A:
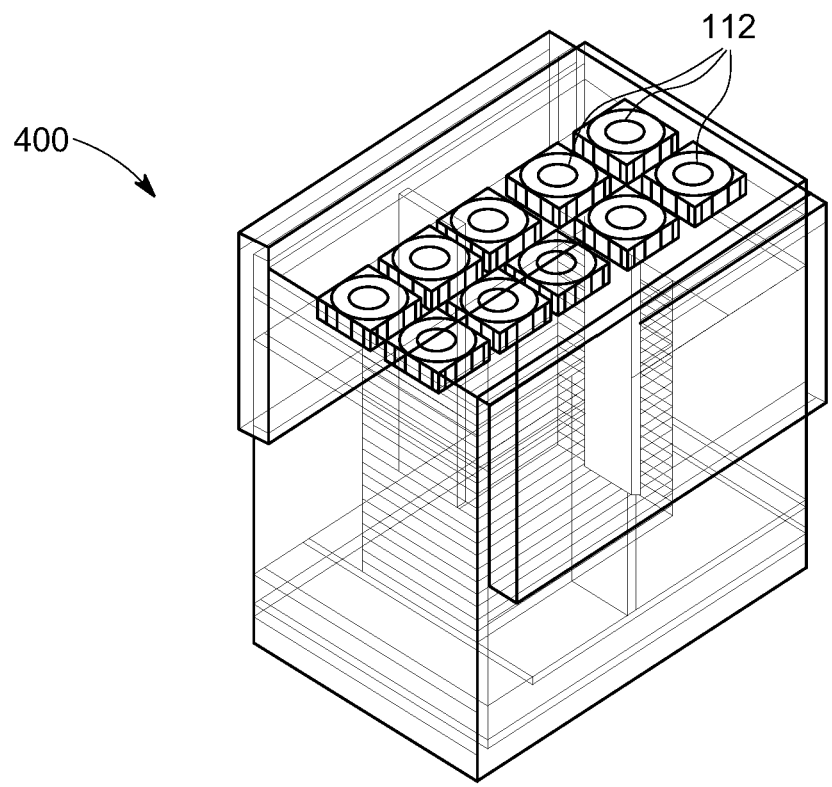
FIG. 4A is a perspective view of a compute cabinet assembly having electric fans positioned in a rectangular configuration, according to certain aspects of the present disclosure.
Figure 4B:
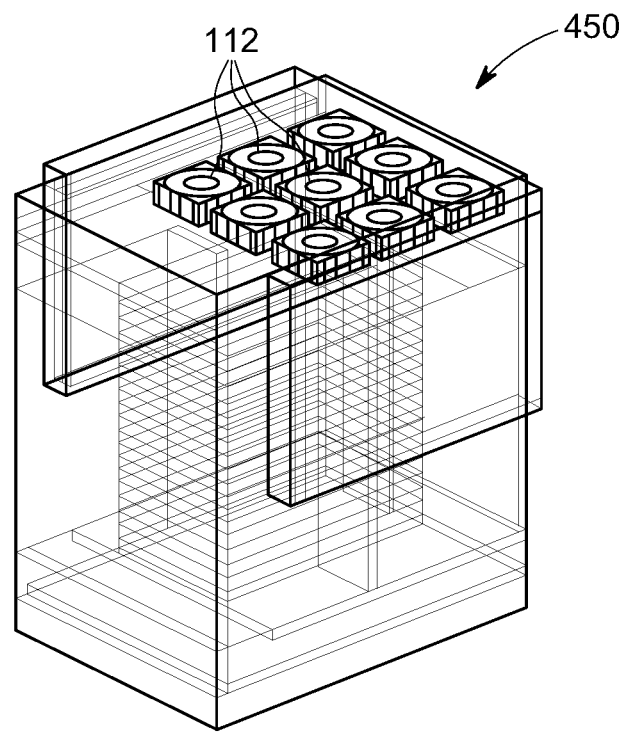
FIG. 4B is a perspective view of a compute cabinet assembly having electric fans positioned in a square configuration, according to certain aspects of the present disclosure.

Referring now to FIGS. 4A-4B, the electric fans are shown in different configurations. As previously mentioned, the cabinet fan module of a given compute cabinet assembly may include a plurality of electric fans (e.g., cabinet fans) therein. These fans may assist in creating an airflow that cools the various electrical components implemented in the assembly. Accordingly, the fans are preferably placed in a configuration that produces desirable airflow(s).

Looking specifically to FIG. 4A, the electric fans 112 are shown in a compute cabinet assembly 400 as being positioned in a rectangular configuration in the cabinet fan module 106. With respect to the present description, a "rectangular configuration" is intended to refer to a situation where each fan is positioned adjacent to each other such that blades in each electric fan rotate coplanar to each other.

While positioning the electric fans 112 in a rectangular configuration produces desirable airflow throughout the assembly 400, the electric fans 112 may again be positioned in different configurations. For instance, FIG. 4B shows the electric fans 112 positioned in the compute cabinet assembly 450 as being positioned in a square configuration. However, any desired configuration (e.g., pattern, shape, design, random organization, etc.) may be implemented.

It follows that various ones of the approaches included herein are able to significantly improve thermal capacity and reduce noise without limiting performance. In other words, the approaches herein are able to significantly improve the thermal regulation of compute cabinet assemblies like edge servers and HPC servers, while also reducing their noise profiles such that they may be place in locations having greater noise sensitivity than typical server warehouses. However, these improvements to thermal and noise regulation do not result in a corresponding reduction in performance, e.g., as typically experienced by conventional implementations. In fact, the Inventors have verified with testing, that some of the approaches described herein are able to support over 20 kW of heat dissipation combined with over 25 dBA of noise removal at the same time. Again, this has been conventionally unachievable.

According to some of these approaches, the heat and noise dissipation is achieved at least partially as a result of dividing the compute cabinet assembly into four portions (air inlet channel, air outlet channels, equipment room, and cabinet fan zone). Moreover, by positioning the air inlet channel at the bottom of the assembly, cold air is allowed to enter and absorbs the noise emitting from the components in the assembly. The air outlet channels are located on two sides of the equipment room, thereby allowing hot air to exit and absorb the noise emitting from the components in the assembly. The cabinet fan module includes various electric fans, and is positioned on the top of the equipment room to create sufficient airflow to cool the components in the assembly.

It follows that the improvements that are achieved by the various approaches included herein may be realized (e.g., experienced) in response to simply activating the electric fans and/or electrical components 103 in the equipment room 102. In other words, while the various physical portions of a compute cabinet assembly and/or the electrical components may vary depending on the implementation, they may be configured to create an airflow path in response to receiving instructions to do so.

Figure 5:
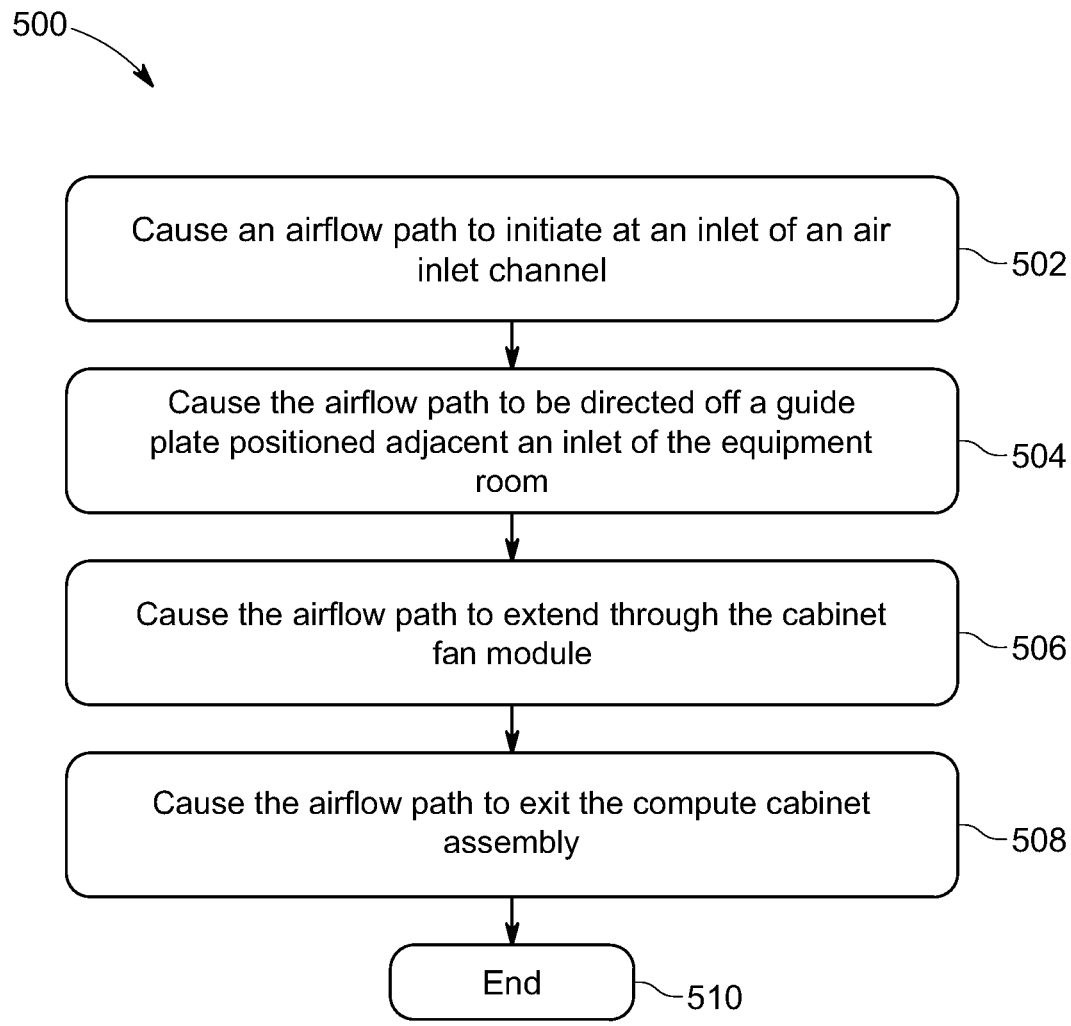
FIG. 5 is a flowchart of an example method for providing cooling capacity to a compute cabinet assembly, according to certain aspects of the present disclosure.

For example, FIG. 5 illustrates a method 500 for providing cooling capacity to a compute cabinet assembly as shown according to one embodiment. Specifically, the various processes included in method 500 are described with respect to a compute cabinet assembly having a similar configuration to the compute cabinet assembly 100 depicted in FIGS. 1A-1D. However, the method 500 may be performed in accordance with the present invention in any of the environments depicted in FIGS. 1A-4B, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller, a processor, a computer, etc., or some other device having one or more processors therein. Thus, in some embodiments, method 500 may be a computer-implemented method. Moreover, the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 5, operation 502 of method 500 includes causing an airflow path to initiate at an inlet of an air inlet channel coupled to a first side of an equipment room. In other words, operation 502 may be achieved by activating one or more electric fans and/or electrical components in the equipment room. These fans and/or components may be activated in some approaches by sending one or more activation instructions to one or more controllers configured to operate the respective fans and/or components. In other implementations, operation 502 may be performed by a processor that is configured to operate the respective fans and/or components, and thereby the airflow path may be initiated by simply activating one or more motors therein.

Operation 504 includes causing the airflow path to be directed off a guide plate positioned adjacent an inlet of the equipment room. As noted above, a guide plate may be configured to uniformly distribute (e.g., direct, disperse, etc.) the airflow path through the equipment room. Causing the airflow path to pass over a guide plate configured in this manner thereby results in the airflow path to extend through the equipment room in a desired manner. The equipment room may also have blocking plates implemented therein, the blocking plates being configured to prevent airflow backflow in the equipment room. The blocking plates may thereby be able to further improve the thermal performance of the assembly as a whole as the airflow path extends therethrough.

Moreover, operation 506 includes causing the airflow path to extend through the cabinet fan module. As noted above, the cabinet fan module is coupled to an outlet of the equipment room in some implementations. Moreover, the cabinet fan module includes a plurality of electric fans therein that are able to generate the airflow path, at least in part. It follows that the airflow path may extend directly through the electric fans in the cabinet fan module when passing therethrough.

Operation 508 further includes causing the airflow path to exit the compute cabinet assembly. The airflow path preferably exits the compute cabinet assembly at first and second outlets of first and second respective air outlet channels. In preferred approaches, the first and second air outlet channels are coupled to the cabinet fan module and extending along third and fourth respective sides of the equipment room. As noted above, this reduces the noise footprint of the assembly as a whole by using the exhaust air to at least partially muffle the noise created by the assembly, e.g., as would be appreciated by one skilled in the art after reading the present description.

It should also be noted that operations 504, 506, 508 may be performed (e.g., accomplished) as a result of the physical configurations of the corresponding compute cabinet assembly and how those physical configurations affect the airflow path. For example, causing the airflow path to be directed off a guide plate as described in operation 504 above may be achieved as a result of positioning the guide plate adjacent the inlet of the equipment room. The air entering the equipment room through the inlet thereby comes into contact with the guide plate and is directed as desired through the equipment room as a result. However, in other implementations operations 504, 506, 508 may be performed in response to operating the electric fans and/or electrical components in a specific manner to achieve a certain airflow through the assembly.

From operation 508, the flowchart of FIG. 5 proceeds to operation 510, whereby method 500 may end. However, it should be noted that although method 500 may end upon reaching operation 510, any one or more of the processes included in method 500 may be repeated in order to maintain the airflow path in a compute cabinet assembly. In other words, any one or more of the processes included in method 500 may be repeated any desired number of times to maintain the thermal regulation and reduced noise profile achieved.

It should be noted that, while various aspects of the implementations herein have been illustrated as including specific designs, orientations, numbers of components, etc., this is in no way intended to limit the invention. Rather, the implementations herein are presented for exemplary purposes only and may vary in design, orientation, number of components, etc., depending on the desired approach. It should also be noted that use of the terms "bottom", "lower", "top", "upper", etc., are in no way intended to be limiting. Any frames of reference used to describe the various implementations herein have been selected for illustrative purposes only and may be adjusted as desired.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A compute cabinet assembly for providing cooling capacity and noise reduction, the compute cabinet assembly comprising:
    an equipment room configured to implement electrical components therein, the equipment room having a room air inlet for receiving cooling air for the electrical components, the equipment room further having a first side that is opposite a second side, the equipment room further having a third side extending between the first side and the second side;
    an air inlet channel positioned adjacent to the first side of the equipment room;
    a cabinet fan module positioned adjacent to the second side of the equipment room;
    an air outlet channel positioned adjacent to the cabinet fan module and extending along the third side of the equipment room;
    an airflow path originating at the air inlet channel, the airflow path extending through the equipment room and the cabinet fan module, the airflow path exiting the compute cabinet assembly at the air outlet channel;
    a guide plate positioned adjacent to the room air inlet, the guide plate extending across a width of the airflow path to uniformly distribute the cooling air across the airflow path as it enters the equipment room;
    a first blocking plate extending between the electrical components and the third side of the equipment room; and
    a second blocking plate extending between the electrical components and a fourth side of the equipment room opposite the third side;
    wherein a value of a first height of the first blocking plate is less than or equal to half a value of a room height of the equipment room, a value of a second height of the second blocking plate being less than or equal to half the value of the room height.

2. The compute cabinet assembly of claim 1, wherein the guide plate extends at least as wide as the airflow path, the airflow path having the same width as the room air inlet.

3. The compute cabinet assembly of claim 2, wherein the guide plate is positioned at an angle relative to the first side of the equipment room.

4. The compute cabinet assembly of claim 3, wherein the angle is between about 45 degrees and about 90 degrees.

5. The compute cabinet assembly of claim 1, further comprising another air outlet channel positioned adjacent to the cabinet fan module and extending along the fourth side.

6. The compute cabinet assembly of claim 1, wherein the first and second blocking plates are positioned such that backflow caused by the electrical components is prevented along the airflow path.

7. The compute cabinet assembly of claim 6, wherein the first and second blocking plates are each (i) positioned adjacent to the first side of the equipment room, and (ii) spaced from the second side of the equipment room.

8. A compute cabinet assembly for providing cooling capacity and noise reduction, the compute cabinet assembly comprising:
an equipment room configured to implement electrical components therein, the equipment room having a room air inlet for receiving cooling air for the electrical components, the equipment room further having a first side that is opposite a second side, the equipment room further having a third side extending between the first side and the second side;
an air inlet channel positioned adjacent to the first side of the equipment room;
a cabinet fan module positioned adjacent to the second side of the equipment room;
an air outlet channel positioned adjacent to the cabinet fan module and extending along the third side of the equipment room;
electric fans positioned in the cabinet fan module, the electric fans being configured to create an airflow path originating at the air inlet channel, the airflow path extending through the equipment room and the cabinet fan module, the airflow path exiting the compute cabinet assembly at the air outlet channel;
a first blocking plate extending between the electrical components and the third side of the equipment room; and
a second blocking plate extending between the electrical components and a fourth side of the equipment room opposite the third side
wherein a value of a first height of the first blocking plate is less than or equal to half a value of a room height of the equipment room, a value of a second height of the second blocking plate being less than or equal to half the value of the height.

9. The compute cabinet assembly of claim 8, further comprising another air outlet channel positioned adjacent to the cabinet fan module and extending along the fourth side.

10. The compute cabinet assembly of claim 8, wherein the first and second blocking plates are positioned such that backflow caused by the electrical components is prevented in the equipment room.

11. The compute cabinet assembly of claim 8, the compute cabinet assembly further comprising:
a guide plate positioned adjacent to the room air inlet, the guide plate extending across a width of the airflow path to uniformly distribute the cooling air across the airflow path as it enters the equipment room.

12. The compute cabinet assembly of claim 11, wherein the guide plate extends at least as wide as the airflow path, the airflow path having the same width as the room air inlet.

13. The compute cabinet assembly of claim 11, wherein the guide plate is positioned at an angle relative to the first side of the equipment room.

14. The compute cabinet assembly of claim 11, wherein the angle is between about 45 degrees and about 90 degrees.

15. The compute cabinet assembly of claim 8, wherein the first and second blocking plates are each (i) positioned adjacent to the first side of the equipment room, and (ii) spaced from the second side of the equipment room.

16. The compute cabinet assembly of claim 8, wherein the equipment room is configured to receive a plurality of edge servers or high performance computing servers therein.

17. A compute cabinet assembly for providing cooling capacity and noise reduction, the compute cabinet assembly comprising:
an equipment room configured to implement electrical components therein, the equipment room having a room air inlet for receiving cooling air for the electrical components, the equipment room further having a first side that is opposite a second side, the equipment room further having a third side extending between the first side and the second side;
an air inlet channel positioned adjacent to the first side of the equipment room;
a cabinet fan module positioned adjacent to the second side of the equipment room;
an air outlet channel positioned adjacent to the cabinet fan module and extending along the third side of the equipment room;
an airflow path originating at the air inlet channel, the airflow path extending through the equipment room and the cabinet fan module, the airflow path exiting the compute cabinet assembly at the air outlet channel;
a guide plate positioned adjacent to the room air inlet, the guide plate extending across a width of the airflow path to uniformly distribute the cooling air across the airflow path as it enters the equipment room;
a first blocking plate extending between the electrical components and the third side of the equipment room; and
a second blocking plate extending between the electrical components and a fourth side of the equipment room opposite the third side;
wherein the first and second blocking plates are positioned such that backflow caused by the electrical components is prevented along the airflow path.

18. A compute cabinet assembly for providing cooling capacity and noise reduction, the compute cabinet assembly comprising:
an equipment room configured to implement electrical components therein, the equipment room having a room air inlet for receiving cooling air for the electrical components, the equipment room further having a first side that is opposite a second side, the equipment room further having a third side extending between the first side and the second side;
an air inlet channel positioned adjacent to the first side of the equipment room;
a cabinet fan module positioned adjacent to the second side of the equipment room;
an air outlet channel positioned adjacent to the cabinet fan module and extending along the third side of the equipment room;

electric fans positioned in the cabinet fan module, the electric fans being configured to create an airflow path originating at the air inlet channel, the airflow path extending through the equipment room and the cabinet fan module, the airflow path exiting the compute cabinet assembly at the air outlet channel;

a first blocking plate extending between the electrical components and the third side of the equipment room; and a second blocking plate extending between the electrical components and a fourth side of the equipment room opposite the third side;

wherein the first and second blocking plates are positioned such that backflow caused by the electrical components is prevented in the equipment room.

19. A compute cabinet assembly for providing cooling capacity and noise reduction, the compute cabinet assembly comprising:

an equipment room configured to implement electrical components therein, the equipment room having a room air inlet for receiving cooling air for the electrical components, the equipment room further having a first side that is opposite a second side, the equipment room further having a third side extending between the first side and the second side;

an air inlet channel positioned adjacent to the first side of the equipment room;

a cabinet fan module positioned adjacent to the second side of the equipment room;

an air outlet channel positioned adjacent to the cabinet fan module and extending along the third side of the equipment room;

an airflow path originating at the air inlet channel, the airflow path extending through the equipment room and the cabinet fan module, the airflow path exiting the compute cabinet assembly at the air outlet channel;

a first blocking plate extending between the electrical components and the third side of the equipment room; and a second blocking plate extending between the electrical components and a fourth side of the equipment room opposite the third side;

wherein the first and second blocking plates are positioned such that backflow caused by the electrical components is prevented along the airflow path.

20. A compute cabinet assembly for providing cooling capacity and noise reduction, the compute cabinet assembly comprising:

an equipment room configured to implement electrical components therein, the equipment room having a room air inlet for receiving cooling air for the electrical components, the equipment room further having a first side that is opposite a second side, the equipment room further having a third side extending between the first side and the second side;

an air inlet channel positioned adjacent to the first side of the equipment room;

a cabinet fan module positioned adjacent to the second side of the equipment room;

an air outlet channel positioned adjacent to the cabinet fan module and extending along the third side of the equipment room;

a first blocking plate extending between the electrical components and the third side of the equipment room; and a second blocking plate extending between the electrical components and a fourth side of the equipment room opposite the third side;

wherein the first and second blocking plates are positioned such that backflow caused by the electrical components is prevented in the equipment room.

* * * * *